(12) United States Patent
Sasaki et al.

(10) Patent No.: US 7,508,268 B2
(45) Date of Patent: Mar. 24, 2009

(54) POWER AMPLIFIER AND TRANSMISSION AND RECEPTION SYSTEM

(75) Inventors: Tadahiro Sasaki, Tokyo (JP); Kazuhide Abe, Kawasaki (JP); Kazuhiko Itaya, Yokohama (JP); Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 11/857,737

(22) Filed: Sep. 19, 2007

(65) Prior Publication Data
US 2008/0238550 A1    Oct. 2, 2008

(30) Foreign Application Priority Data
Mar. 26, 2007  (JP) .............................. 2007-079267

(51) Int. Cl.
H03F 3/68  (2006.01)
(52) U.S. Cl. .................................. 330/295; 330/124 R
(58) Field of Classification Search ................. 330/295, 330/124 R, 51, 84, 126
See application file for complete search history.

(56) References Cited

U.S. PATENT DOCUMENTS

| | | | |
|---|---|---|---|
| 6,194,968 B1 | 2/2001 | Winslow | |
| 6,975,735 B1 * | 12/2005 | Kinoshita | 381/163 |
| 7,317,804 B2 * | 1/2008 | Kinoshita | 381/163 |
| 7,375,588 B2 * | 5/2008 | Yamakawa et al. | 330/289 |

FOREIGN PATENT DOCUMENTS

| | | |
|---|---|---|
| JP | 2003-17946 | 1/2003 |
| JP | 2003-152513 | 5/2003 |

OTHER PUBLICATIONS

U.S. Appl. No. 11/687,770, filed Mar. 19, 2007, Kazuhide Abe, et al.
U.S. Appl. No. 11/678,996, filed Feb. 26, 2007, Yutaka Onozuka.
U.S. Appl. No. 11/857,737, filed Sep. 19, 2007, Sasaki, et al.
U.S. Appl. No. 11/871,451, filed Oct. 12, 2007, Abe, et al.

\* cited by examiner

*Primary Examiner*—Henry K Choe
(74) *Attorney, Agent, or Firm*—Oblon, Spivak, McClelland, Maier & Neustadt, P.C.

(57) ABSTRACT

A power amplifier includes: a first multi-finger FET formed on a semiconductor substrate; a second multi-finger FET formed on the semiconductor substrate; a first temperature detector which detects a channel temperature of the first FET; a second temperature detector which detects a channel temperature of the second FET; a third temperature detector which detects a temperature of the semiconductor substrate; a first detection circuit detecting a difference between an output of the first temperature detector and an output of the third temperature detector and converting the difference to thermoelectromotive force; a second detection circuit detecting a difference between an output of the second temperature detector and the output of the third temperature detector and converting the difference to thermoelectromotive force; and a comparator comparing outputs of the first and second detection circuits with each other to turn on one of the first and second switches and turn off the other.

15 Claims, 7 Drawing Sheets

A-A SECTIONAL VIEW

POWER AMPLIFIER AND TRANSMISSION AND RECEPTION SYSTEM

CROSS-REFERENCE TO RELATED APPLICATION

This application is based upon and claims the benefit of priority from prior Japanese Patent Application No. 2007-79267 filed on Mar. 26, 2007 in Japan, the entire contents of which are incorporated herein by reference.

BACKGROUND OF THE INVENTION

1. Field of the Invention

The present invention relates to a power amplifier having a multi-finger FET and a transmission and reception system.

2. Related Art

In general, as the FET included in the power amplifier, a multi-finger FET which facilitates the current synthesis is widely used. When normal operation is conducted and a gate voltage $V_G$ is made constant, the multi-finger FET has static characteristics in which a linear region where a drain current Id is proportional to a drain voltage Vdd and a saturation region where the drain current Id is saturated and the drain current Id becomes nearly constant appear. When heat is generated in the FET, however, a negative resistance component appears in a region which should become the saturation region of the static characteristics and an output current remarkably reduces. As compared with power characteristics in the normal operation, therefore, degraded power characteristics are exhibited.

If in a power amplifier using a plurality of multi-finger FETs heat is generated by each of the multi-finger FETs, the possibility that current phase differences between FETs will appear due to performance degradation caused by the negative resistance component resulting in occurrence of a loop current becomes high. If the loop current begins to occur, a kink phenomenon occurs in the power characteristics and the linearity of the output power to the input power degrades remarkably.

As means for preventing the degradation in linearity, heat is radiated via a substrate by making the gate pitch of the multi-finger FETs large and providing a redundant region in order to mitigate the temperature rise in FET channels. In this case, however, there is a problem that the area of the power amplifier increases.

According to a known technique, temperature balances among a plurality of power FETs connected in parallel are compensated by providing temperature sensors respectively for the power FETs, detecting an output difference among these temperature sensors, and performing negative feedback of the difference output to a gate of one of the FETs (see, for example, JP-A 2003-152513 (KOKAI)).

According to the technique described in JP-A 2003-152513 (KOKAI), however, the temperature sensors are provided on modularized casings, and consequently there is a possibility that a delay time will be caused in detection of temperature changes in FET channels and control will not be able to be exercised. Furthermore, since the temperature changes of the FETs are amplified by using operational amplifiers, a region where the operational amplifiers are provided and new power for driving the operational amplifiers become necessary.

Therefore, it becomes unsuitable to apply the technique described in JP-A 2003-152513 (KOKAI) to the power amplifier including multi-finger FETs.

SUMMARY OF THE INVENTION

The present invention has been made in view of these circumstances, and an object thereof is to provide a power amplifier and a transmission and reception system capable of suppressing degradation of linearity caused by generation of a loop current which is in turn caused by thermal degradation.

A power amplifier according to a first aspect of the present invention includes: an input terminal; first and second switches connected at respective first ends to the input terminal in common; a first multi-finger FET formed on a semiconductor substrate and connected at a gate thereof to a second end of the first switch; a second multi-finger FET formed on the semiconductor substrate and connected at a gate thereof to a second end of the second switch; an output terminal connected in common to drains of the first and second FETs; a first temperature detector which detects a channel temperature of the first FET; a second temperature detector which detects a channel temperature of the second FET; a third temperature detector which detects a temperature of the semiconductor substrate; a first detection circuit which detects a difference between an output of the first temperature detector and an output of the third temperature detector and converts the difference to thermoelectromotive force; a second detection circuit which detects a difference between an output of the second temperature detector and the output of the third temperature detector and converts the difference to thermoelectromotive force; and a comparator which compares outputs of the first and second detection circuits with each other to turn on one of the first and second switches and turn off the other.

A transmission and reception system according to a second aspect of the present invention includes: a reception circuit, and a transmission circuit having a power amplifier, wherein the power amplifier is the power amplifier according to the first aspect.

DETAILED DESCRIPTION OF THE INVENTION

Hereafter, embodiments of the present invention will be described in detail with reference to the drawings.

First Embodiment

Figure 1:
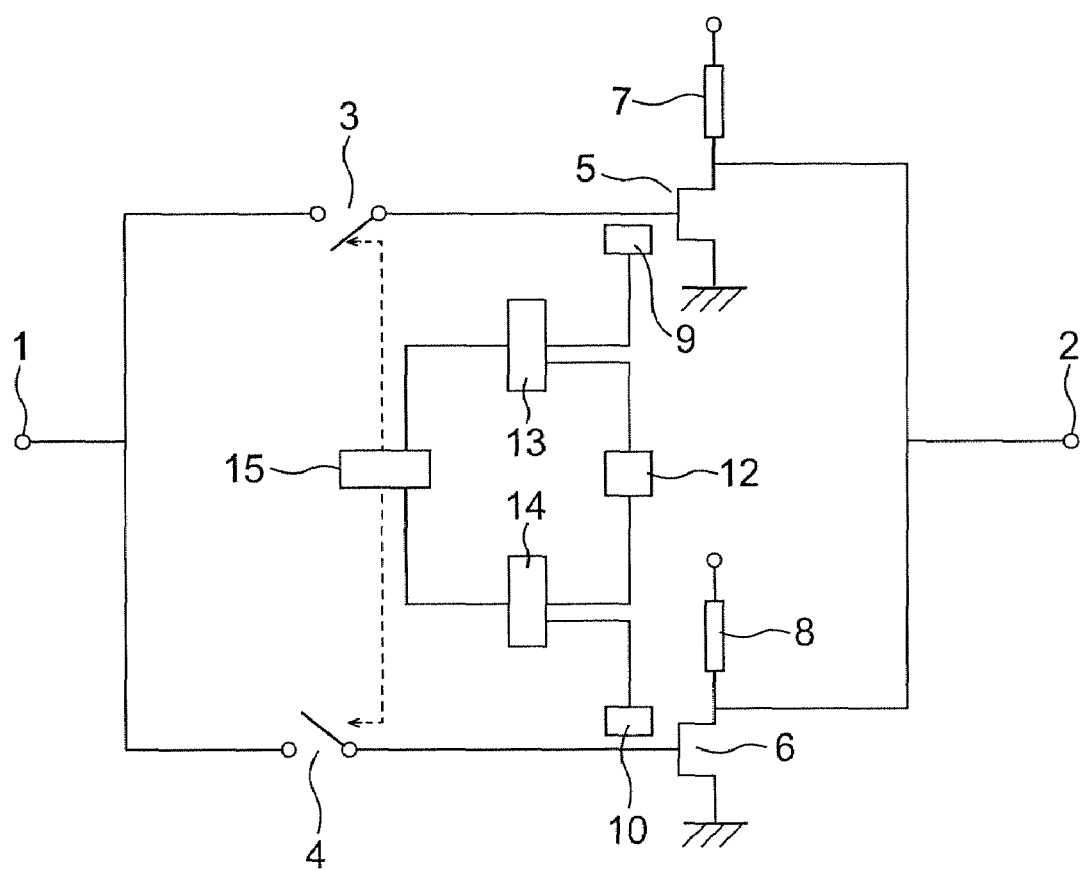
FIG. 1 is a circuit diagram showing a power amplifier according to a first embodiment.

A power amplifier according to a first embodiment of the present invention is shown in FIG. 1. The power amplifier according to the present embodiment is formed on a silicon substrate (not illustrated). The power amplifier includes an input terminal 1, an output terminal 2, switches 3 and 4, FETs 5 and 6, choke inductances 7 and 8, temperature detectors 9 and 10, a reference temperature detector 12, detection circuits 13 and 14, and a potential comparator 15. The power amplifier has a configuration in which power synthesis is conducted on two FETs 5 and 6. The switch 3 turns on or off connection between the input terminal 1 and a gate of the FET 5. The switch 4 turns on or off connection between the input terminal 1 and a gate of the FET 6. The switches 3 and 4 are controlled to turn on or off by the potential comparator 15.

The FET 5 is connected at its drain to a drive voltage via the choke inductance 7 and to the output terminal 2, and connected at its source to ground. The FET 6 is connected at its drain to the drive voltage via the choke inductance 8 and to the output terminal 2, and connected at its source to the ground. Each of the FETs 5 and 6 is a comb multi-finger type FET.

The temperature detectors 9 and 10 detect channel temperatures of the FETs 5 and 6, respectively. The reference temperature detector 12 detects the temperature of the silicon substrate. The detection circuit 13 converts a difference between the channel temperature of the FET 5 detected by the temperature detector 9 and the temperature of the silicon substrate detected by the reference temperature detector 12 to thermoelectromotive force (Seebeck electromotive force) corresponding to the difference. If a value obtained by the conversion is lower than a reference value (for example, 120° C. in temperature difference), then the detection circuit 13 outputs "0." If the value is equal to at least the reference value, then the detection circuit 13 outputs "1." The detection circuit 14 converts a difference between the channel temperature of the FET 6 detected by the temperature detector 10 and the temperature of the silicon substrate detected by the reference temperature detector 12 to thermoelectromotive force (Seebeck electromotive force) corresponding to the difference. If a value obtained by the conversion is lower than a reference value (for example, 120° C. in temperature difference), then the detection circuit 14 outputs "0." If the value is equal to at least the reference value, then the detection circuit 14 outputs "1."

The potential comparator 15 compares outputs of the detection circuit 13 and the detection circuit 14, and determines whether the channel temperature of either the FET 5 or the FET 6 is lower than the reference value. The potential comparator 15 controls on/off of the switches 3 and 4 so as to connect the gate of the FET in which the channel temperature is lower than the reference value to the input terminal 1.

Figure 2:
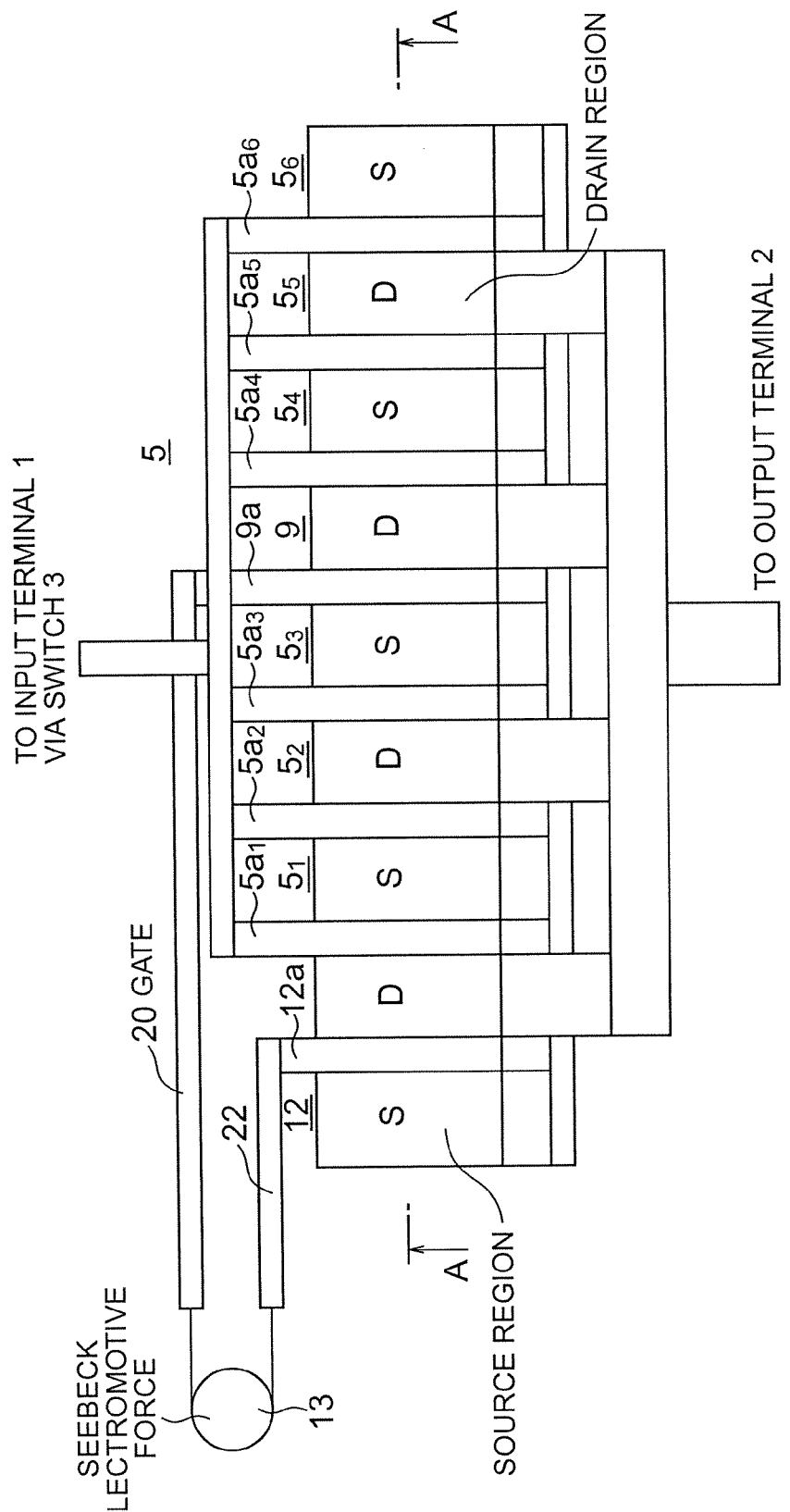
FIG. 2 is a plan view of the power amplifier according to the first embodiment.
Figure 3:
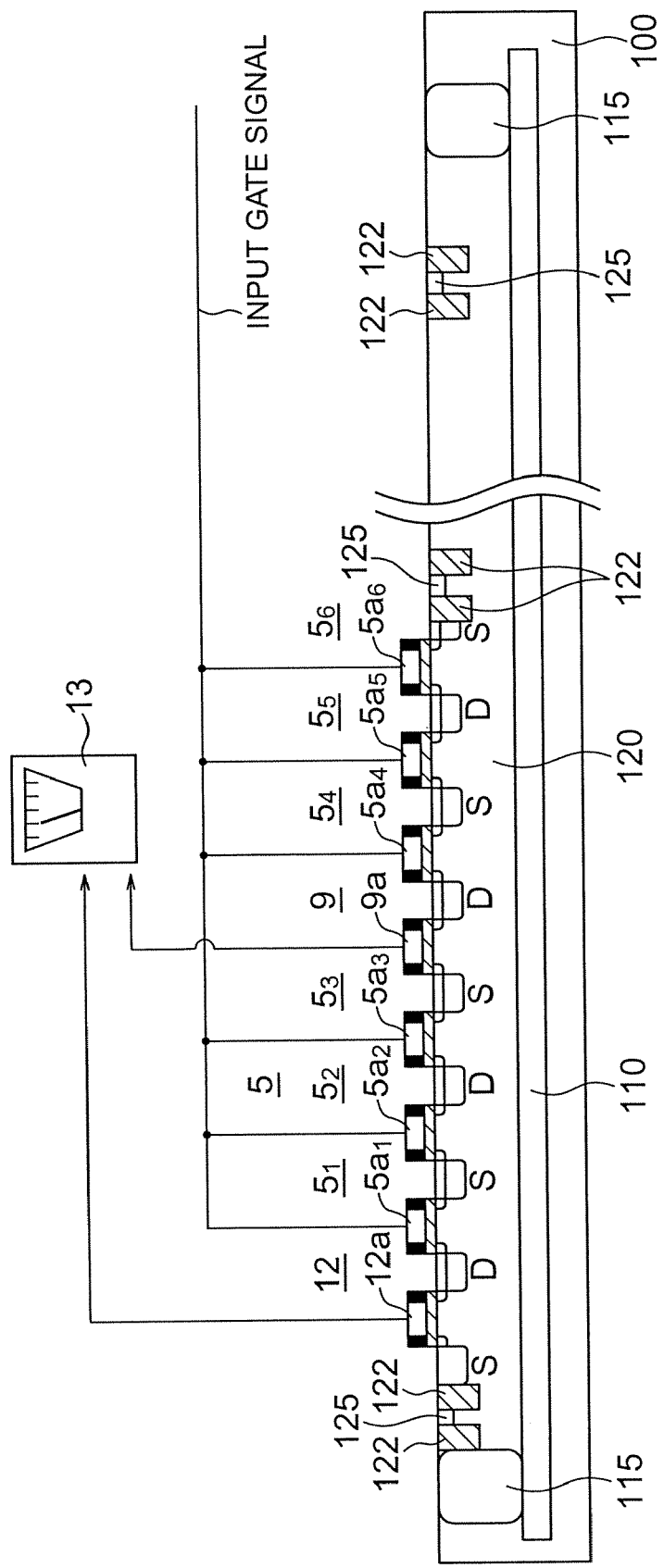
FIG. 3 is a sectional view of the power amplifier according to the first embodiment.

A plan view of a concrete example of the comb multi-finger FET 5 is shown in FIG. 2. A section view obtained by cutting the FET along a cutting line A-A is shown in FIG. 3. The FET 5 includes six FETs $5_1$ to $5_6$. As shown in FIG. 3, the FETs $5_1$ to $5_6$ are formed on a P well region 120 provided on a deep N well region 110 in a silicon substrate 100. The FET $5_2$ is provided on the right side of the FET $5_1$ so as to be adjacent to the FET $5_1$ and share a source region S with the FET $5_1$. The FET $5_3$ is provided on the right side of the FET $5_2$ so as to be adjacent to the FET $5_2$ and share a drain region D with the FET $5_2$. The FET $5_5$ is provided on the right side of the FET $5_4$ so as to be adjacent to the FET $5_4$ and share a source region S with the FET $5_4$. The FET $5_6$ is provided on the right side of the FET $5_5$ so as to be adjacent to the FET $5_5$ and share a drain region D with the FET $5_5$. A dummy transistor serving as the reference temperature detector 12 is provided on the left side of the FET $5_1$ so as to be adjacent to FET $5_1$ and share a drain region D with the FET $5_1$. A dummy transistor serving as the temperature detector 9 is provided between the FET $5_3$ and the FET $5_4$. The dummy transistor 9 shares a source region S with the FET $5_3$ and shares a drain region D with the FET $5_4$. As shown in FIG. 2, gates $5a_1$ to $5a_6$ respectively of the FET $5_1$ to FET $5_6$ are connected in common and connected to the input terminal 1 via the switch 3. The drain regions D respectively of the FET $5_1$ to FET $5_6$ are connected in common and connected to the output terminal 2. The source regions S respectively of the FET $5_1$ to FET $5_6$ and a source region S of the dummy transistor 12 are connected in common and connected to the ground. As shown in FIG. 3, a P well contact 125 is provided on the left side of the source region S of the dummy transistor 12 via an element isolation region 122. An N well contact 115 is provided on the left side of the P well contact 125 via an element isolation region 122. A P well contact 125 is provided on the right side of the source region S of the FET $5_6$ via an element isolation region 122. The N well 110 and the P well 120 are connected to the ground power supply respectively via the contact 115 and 125.

The dummy transistor serving as the temperature detector 9 detects the temperature obtained by heat generation in the channel part at the time of RF operation of the power amplifier, as the temperature of the gate of the dummy transistor 9. The dummy transistor serving as the reference temperature detector 12 detects the temperature of the silicon substrate as the temperature of the gate of the dummy transistor 12. A gate 9a of the dummy transistor 9 and a gate 12a of the dummy transistor 12 are connected to the detection circuit 13 via wires 20 and 22, respectively. Seebeck electromotive force corresponding to the temperature difference between the wires 20 and 22 is output from the detection circuit 13. The Seebeck coefficient in silicon is typically in the range of 0.1 mV/° C. to 1 mV/° C. When a limit temperature of FET channels is 150° C. and the temperature (=room temperature) of the silicon substrate is 27° C., therefore, a potential in the range of approximately 12.3 mV to 123 mV (=(150−27)×0.1 to 1) is generated. The potential difference is detected by the detection circuits 13 (14). If the potential difference is equal to at least the reference value (for example, 120° C. in temperature difference), then "1" is output. If the potential difference is lower than the reference value, then "0" is output.

Figure 4:
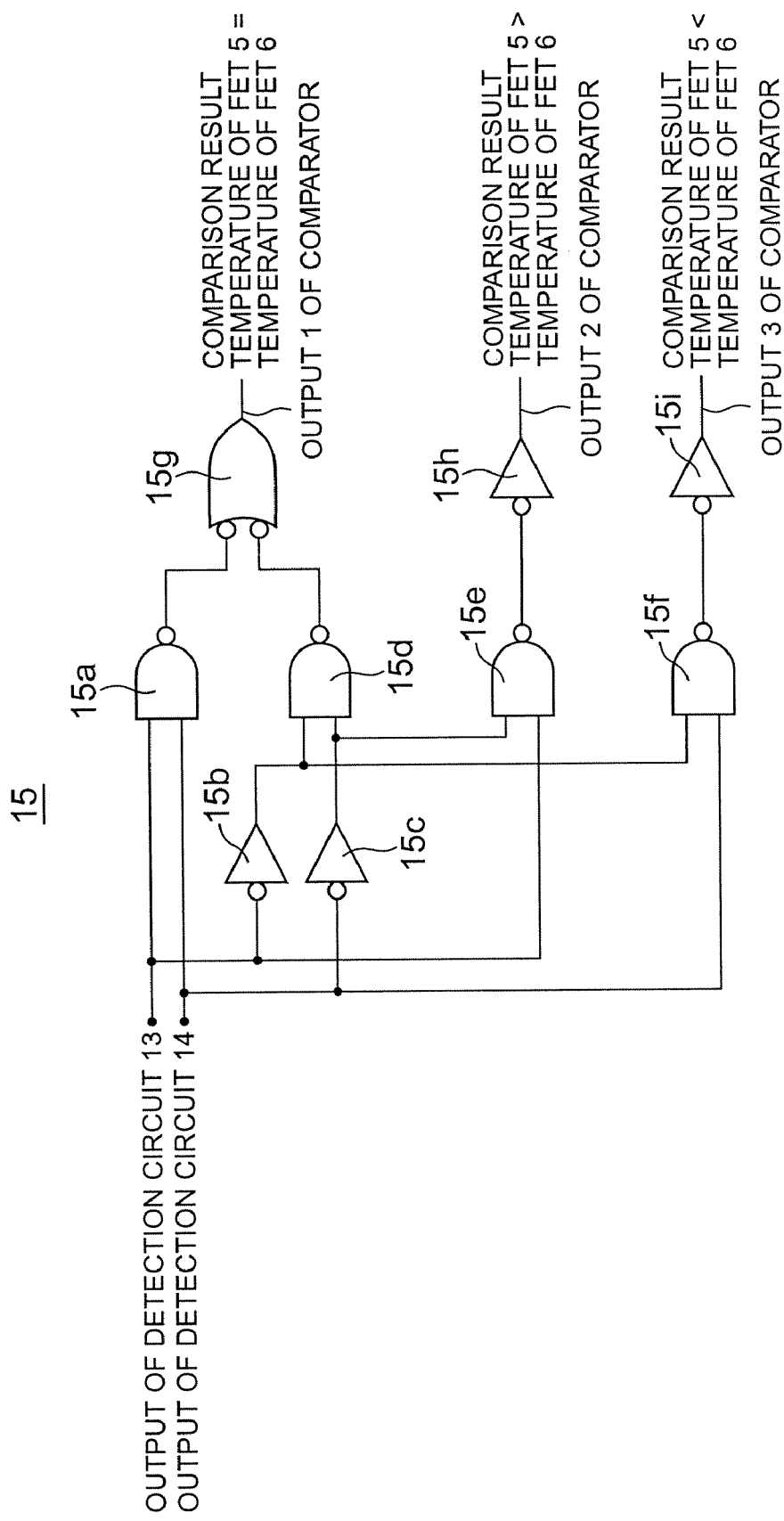
FIG. 4 is a circuit diagram showing a concrete example of a potential comparator in the power amplifier according to the first embodiment.

A concrete example of the potential comparator 15 is shown in FIG. 4. The potential comparator 15 in this concrete example includes a NAND gate 15a, inverters 15b and 15c, NAND gates 15d, 15e and 15f, an exclusive OR gate 15g, and inverters 15h and 15i. The NAND gate 15a performs a NAND operation on the basis of an output of the detection circuit 13 and an output of the detection circuit 14, and sends a result of the operation to the exclusive OR gate 15g. The exclusive OR gate 15g performs an exclusive OR operation on the output of the NAND gate 15a and an output of the NAND gate 15d. The inverters 15b and 15c invert the outputs of the detection circuits 13 and 14, respectively. The NAND gate 15d performs a NAND operation on the basis of outputs of the inverters 15b and 15c, and sends a result of the operation to the exclusive OR gate 15g. The NAND gate 15e performs a NAND operation on the basis of the output of the detection circuit 13 and the output of the inverter 15c, and sends a result of the operation to the inverter 15h. The NAND gate 15f performs a NAND operation on the basis of the output of the detection circuit 14 and the output of the inverter 15b, and sends a result of the operation to the inverter 15i.

If both outputs of the detection circuit 13 and the detection circuit 14 in the potential comparator 15 are "0" or "1," then only an output of the exclusive OR gate 15g goes to "1" and outputs of the inverters 15h and 15i go to "0." In this case, the potential comparator 15 judges the channel temperatures of the FETs 5 and 6 to be equal to each other, and does not conduct changeover of the on/off states of the switches 3 and 4. On the other hand, if the output of the detection circuit 13 is "1" and the output of the detection circuit 14 is "0," only the output of the inverter 15h goes to "1" and outputs of both the exclusive OR gate 15g and the inverter 15i go to "0." In this case, the potential comparator 15 regards the channel temperature of the FET 5 as above the reference value, and exercises control to turn off the switch 3 and turn on the switch 4. If the output of the detection circuit 13 is "0" and the output of the detection circuit 14 is "1," only the output of the inverter 15i goes to "1" and both outputs of the exclusive OR gate 15g and the inverter 15h go to "0." In this case, the potential comparator 15 regards the channel temperature of the FET 6 as above the reference value, and exercises control to turn off the switch 4 and turn on the switch 3.

Figure 5:
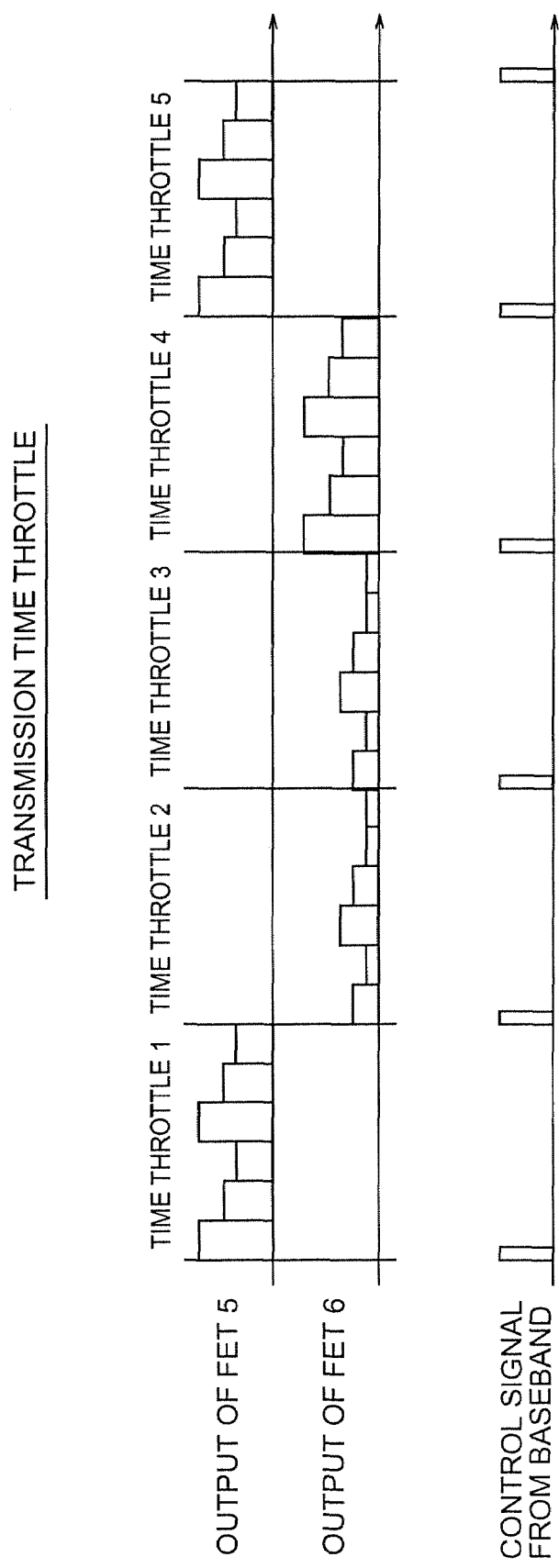
FIG. 5 is a timing chart for explaining operation of the potential comparator.

As shown in FIG. 5, a decision of the on/off control is made every time division in the TDMA (Time Division Multiple Access) system. For example, according to a control signal supplied from the outside immediately before start of each time throttle (e.g. baseband), the potential comparator 15 performs comparison and exercises control to turn on or off the switches 3 and 4 on the basis of a result of the comparison, as shown in FIG. 5. Immediately before start of a time throttle 1, the switch 3 is turned on and the switch 4 is turned off to activate the FET 5 and stop the FET 6. Immediately before start of the next time throttle 2, the difference between the temperature of the channel of the FET 5 and the temperature of the silicon substrate exceeds the reference value, and consequently the switch 3 is turned off and the switch 4 is turned on to stop the operation of the FET 5 and activate the FET 6. Immediately before start of the next time throttle 3, the difference between the temperature of the channel of the FET 6 and the temperature of the silicon substrate is lower than the reference value, and consequently the switch 4 is turned on and the switch 3 is turned off to activate the FET 6 and stop the FET 5. By the way, even if the difference between the temperature of the channel of the FET 5 and the temperature of the silicon substrate is lower than the reference value at this time, the switch 4 is turned on and the switch 3 is turned off. Immediately before start of the next time throttle 4, the difference between the temperature of the channel of the FET 6 and the temperature of the silicon substrate is lower than the reference value, and consequently the switch 4 is turned on and the switch 3 is turned off to activate the FET 6 and stop the FET 5. Immediately before start of the next time throttle 5, the difference between the temperature of the channel of the FET 6 and the temperature of the silicon substrate exceeds the reference value, and consequently the switch 4 is turned off and the switch 3 is turned on to stop the operation of the FET 6 and activate the FET 5.

COMPARATIVE EXAMPLE

Figure 6:
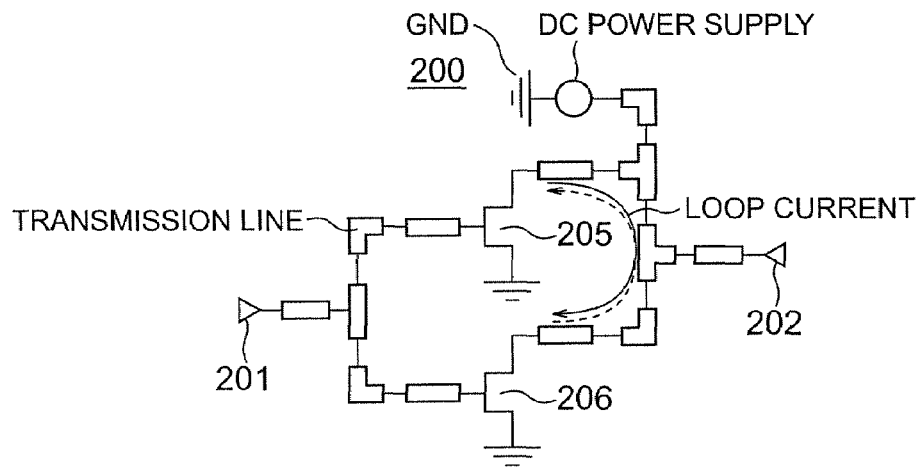
FIG. 6 is a circuit diagram showing a power amplifier according to a comparative example of the first embodiment.
Figure 7:
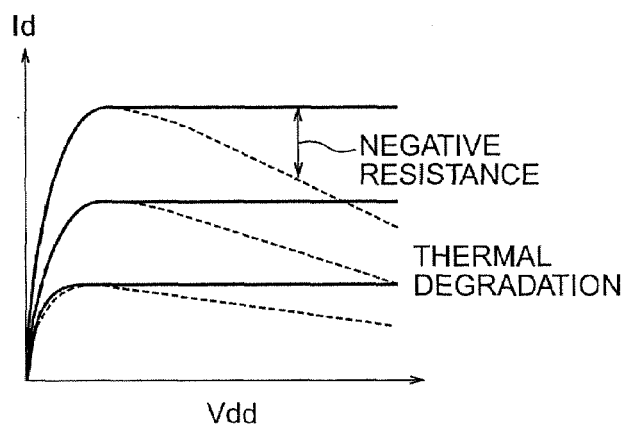
FIG. 7 is a diagram showing static characteristics of FETs in the first embodiment and the comparative example.
Figure 8:
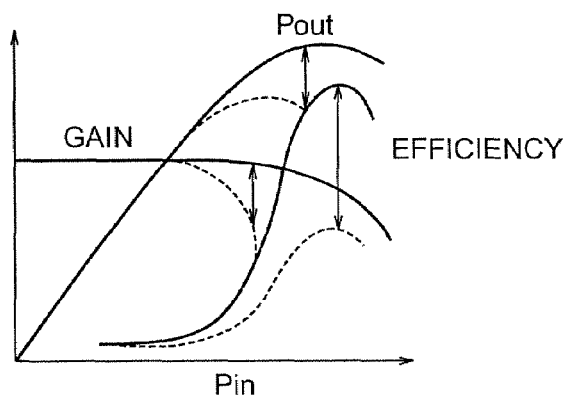
FIG. 8 is a diagram showing output characteristics, gain characteristics and efficiency characteristics in the first embodiment and the comparative example.

A power amplifier according to a comparative example of the present embodiment is shown in FIG. 6. A power amplifier 200 according to the comparative example includes two multi-finger FETs 205 and 206. Gates of the FETs 205 and 206 are connected to an input terminal 201 via transmission lines, and drains of the FETs 205 and 206 are connected to an output terminal 202 via transmission lines. Unlike the present embodiment, detectors for detecting the channel temperature are not provided for the FETs 205 and 206. In other words, although in the comparative example thermal degradation and thermal runaway in each FET can be suppressed, a loop current is generated by a characteristic difference such as a phase difference between the two FETs 205 and 206 because means for feeding back the characteristic change difference between the FETs 205 and 206 caused by heat is not provided. Therefore, static characteristics of the FET according to the comparative example become as represented by dotted lines in FIG. 7. Negative resistance appears in a region which should become a saturation region, and the static characteristics of the FET according to the comparative example are degraded as compared with static characteristics of the FET according to the present embodiment represented by solid lines. Output characteristics, gain characteristics and the efficiency of the power amplifier according to the comparative example represented by dotted lines in FIG. 8 are degraded by the generation of the loop current as compared with output characteristics, gain characteristics and the efficiency of the power amplifier according to the present embodiment represented by solid lines in FIG. 8. In other words, in the present embodiment, the loop current is not apt to occur and the linearity is improved as compared with the comparative example.

According to the present embodiment, degradation of the linearity caused by generation of the loop current due to thermal degradation can be suppressed as heretofore described.

Second Embodiment

Figure 9:
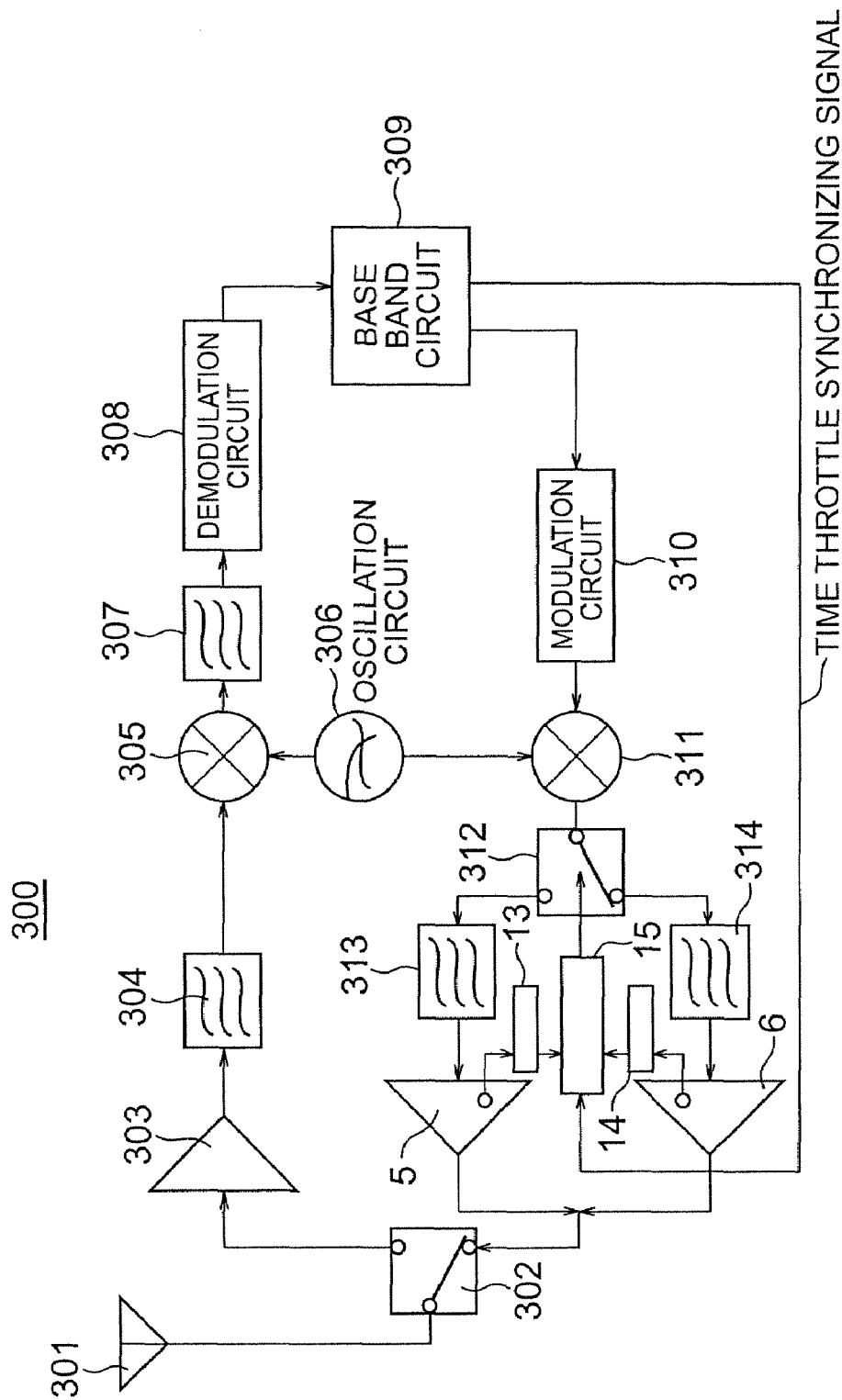
FIG. 9 is a circuit diagram showing a transmission and reception system according to a second embodiment.

A transmission and reception system according to a second embodiment of the present invention is shown in FIG. 9. A transmission and reception system 300 according to the present embodiment includes an antenna 301, an antenna switch 302, a low noise amplifier 303, a filter 304, a mixer 305, an oscillation circuit 306, a filter 307, a demodulation circuit 308, a baseband circuit 309, a modulation circuit 310, a mixer 311, a switch circuit 312, filters 313 and 314, FETs 5 and 6, detection circuits 13 and 14, and a potential comparator 15. The FETs 5 and 6, the detection circuits 13 and 14, and the potential comparator 15 respectively have the same configurations as those of the FETs 5 and 6, the detection circuits 13 and 14, and the potential comparator 15 described with reference to the first embodiment. The switch circuit 312 has a configuration obtained by combining the switches 3 and 4 in the first embodiment.

A signal received by the antenna 301 is sent to the low noise amplifier 303 on the reception side via the antenna switch 302, and amplified by the low noise amplifier 303. The amplified signal is sent to the filter 304. When frequency conversion is conducted in the mixer 305, unnecessary frequencies are removed so as to prevent noise signals from falling in the IF frequency band. The signal passed through the filter 304 is subjected to frequency conversion in the mixer 305 with a signal oscillated by the oscillation circuit 306, and then sent to the filter 307. A desired IF signal is taken out by the filter 307. This IF signal is demodulated by the demodulation circuit 308 and the demodulated signal is sent to the baseband circuit 309.

On the other hand, in the case of transmission, a time throttle synchronizing signal is output from the baseband circuit 309 and a transmission signal is sent to the modulation circuit 310. The transmission signal is modulated in the modulation circuit 310, and the modulated signal is subject to frequency conversion in the mixer 311. The potential comparator 15 is activated on the basis of the time throttle synchronizing signal to compare outputs of the detection circuits 13 and 14 with each other. The potential comparator 15 controls connection in the switch circuit 312 on the basis of a result of the comparison. A signal obtained by conducting the frequency conversion in the mixer 311 is sent to the filter 313 or the filter 314 via the switch circuit 312. Only a signal in a desired RF band is taken out by the filter 313 or the filter 314, sent to the FET 5 or the FET 6, and amplified by the FET 5 or the FET 6. The amplified signal is transmitted via the antenna switch 302 and the antenna 301. In other words, the low noise amplifier 303, the filter 304, the mixer 305, the filter 307 and the demodulation circuit 308 constitute a reception circuit, whereas the modulation circuit 310, the mixer 311, the switch circuit 312, the filters 313 and 314, the FETs 5 and 6, the detection circuits 13 and 14, and the potential comparator 15 constitute a transmission circuit.

In the present embodiment, the power amplifier according to the first embodiment is used as the power amplifier on the transmission side. Therefore, degradation of the linearity caused by generation of the loop current due to thermal degradation can be suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A power amplifier comprising:
   an input terminal;
   first and second switches connected at respective first ends to the input terminal in common;
   a first multi-finger FET formed on a semiconductor substrate and connected at a gate thereof to a second end of the first switch;
   a second multi-finger FET formed on the semiconductor substrate and connected at a gate thereof to a second end of the second switch;
   an output terminal connected in common to drains of the first and second FETs;
   a first temperature detector which detects a channel temperature of the first FET;
   a second temperature detector which detects a channel temperature of the second FET;
   a third temperature detector which detects a temperature of the semiconductor substrate;
   a first detection circuit which detects a difference between an output of the first temperature detector and an output of the third temperature detector and converts the difference to thermoelectromotive force;
   a second detection circuit which detects a difference between an output of the second temperature detector and the output of the third temperature detector and converts the difference to thermoelectromotive force; and
   a comparator which compares outputs of the first and second detection circuits with each other to turn on one of the first and second switches and turn off the other.

2. The amplifier according to claim 1, wherein
   the first FET comprises a first MOS transistor group in which a plurality of MOS transistors are included and adjacent MOS transistors share a source region or a drain region, and a second MOS transistor group in which a plurality of MOS transistors are included and adjacent MOS transistors share a source region or a drain region, gates of the MOS transistors in the first MOS transistor group and gates of the MOS transistors in the second MOS transistor group are connected in common, and drains of the MOS transistors in the first MOS transistor group and drains of the MOS transistors in the second MOS transistor group are connected in common,
   the second FET comprises a third MOS transistor group in which a plurality of MOS transistors are included and adjacent MOS transistors share a source region or a drain region, and a fourth MOS transistor group in which a plurality of MOS transistors are included and adjacent MOS transistors share a source region or a drain region, gates of the MOS transistors in the third MOS transistor group and gates of the MOS transistors in the fourth MOS transistor group are connected in common, and drains of the MOS transistors in the third MOS transistor group and drains of the MOS transistors in the fourth MOS transistor group are connected in common,
   the first temperature detector is a first dummy transistor provided between the first MOS transistor group and the second MOS transistor group,
   the second temperature detector is a second dummy transistor provided between the third MOS transistor group and the fourth MOS transistor group, and
   the third temperature detector is a third dummy transistor provided adjacent to a MOS transistor disposed in the first MOS transistor group so as to be remotest from the second MOS transistor group or adjacent to a MOS transistor disposed in the third MOS transistor group so as to be remotest from the fourth MOS transistor group.

3. The amplifier according to claim 1, wherein each of the first and second detection circuits outputs one of data "0" and "1" when the thermoelectromotive force is lower than a reference value, whereas each of the first and second detection circuits outputs the other of data "0" and "1" when the thermoelectromotive force is equal to or higher than the reference value.

4. The amplifier according to claim 1, wherein every time division in a TDMA system, the comparator compares the outputs of the first and second detection circuits with each other, turns on one of the first and second switches and turns off the other of the first and second switches.

5. The amplifier according to claim 4, wherein
   the comparator turns on the second switch and turns off the first switch when the output of the first detection circuit is higher than the output of the second detection circuit,
   the comparator turns on the first switch and turns off the second switch when the output of the first detection circuit is lower than the output of the second detection circuit, and
   the comparator does not change over on/off states of the first and second switches when the output of the first detection circuit is equal to the output of the second detection circuit.

6. The amplifier according to claim 2, wherein
   the first dummy transistor shares one of source and drain regions with an adjacent MOS transistor in the first MOS transistor group, and shares the other of source and drain regions with an adjacent MOS transistor in the second MOS transistor group, and
   the second dummy transistor shares one of source and drain regions with an adjacent MOS transistor in the third MOS transistor group, and shares the other of source and drain regions with an adjacent MOS transistor in the fourth MOS transistor group.

7. The amplifier according to claim 2, wherein the MOS transistors in the first to fourth MOS transistor group are n-channel MOS transistors.

8. The amplifier according to claim 2, wherein each of the first and second detection circuits outputs one of data "0" and "1" when the thermoelectromotive force is lower than a reference value, whereas each of the first and second detection circuits outputs the other of data "0" and "1" when the thermoelectromotive force is equal to or higher than the reference value.

9. The amplifier according to claim 2, wherein every time division in a TDMA system, the comparator compares the outputs of the first and second detection circuits with each other, turns on one of the first and second switches and turns off the other of the first and second switches.

10. The amplifier according to claim 9, wherein
the comparator turns on the second switch and turns off the first switch when the output of the first detection circuit is higher than the output of the second detection circuit,
the comparator turns on the first switch and turns off the second switch when the output of the first detection circuit is lower than the output of the second detection circuit, and
the comparator does not change over on/off states of the first and second switches when the output of the first detection circuit is equal to the output of the second detection circuit.

11. A transmission and reception system comprising a reception circuit, and a transmission circuit having a power amplifier,
wherein the power amplifier is the power amplifier according to claim 1.

12. The system according to claim 11, wherein
the first FET comprises a first MOS transistor group in which a plurality of MOS transistors are included and adjacent MOS transistors share a source region or a drain region, and a second MOS transistor group in which a plurality of MOS transistors are included and adjacent MOS transistors share a source region or a drain region, gates of the MOS transistors in the first MOS transistor group and gates of the MOS transistors in the second MOS transistor group are connected in common, and drains of the MOS transistors in the first MOS transistor group and drains of the MOS transistors in the second MOS transistor group are connected in common,
the second FET comprises a third MOS transistor group in which a plurality of MOS transistors are included and adjacent MOS transistors share a source region or a drain region, and a fourth MOS transistor group in which a plurality of MOS transistors are included and adjacent MOS transistors share a source region or a drain region, gates of the MOS transistors in the third MOS transistor group and gates of the MOS transistors in the fourth MOS transistor group are connected in common, and drains of the MOS transistors in the third MOS transistor group and drains of the MOS transistors in the fourth MOS transistor group are connected in common,
the first temperature detector is a first dummy transistor provided between the first MOS transistor group and the second MOS transistor group,
the second temperature detector is a second dummy transistor provided between the third MOS transistor group and the fourth MOS transistor group, and
the third temperature detector is a third dummy transistor provided adjacent to a MOS transistor disposed in the first MOS transistor group so as to be remotest from the second MOS transistor group or adjacent to a MOS transistor disposed in the third MOS transistor group so as to be remotest from the fourth MOS transistor group.

13. The system according to claim 11, wherein each of the first and second detection circuits outputs one of data "0" and "1" when the thermoelectromotive force is lower than a reference value, whereas each of the first and second detection circuits outputs the other of data "0" and "1" when the thermoelectromotive force is equal to or higher than the reference value.

14. The system according to claim 11, wherein every time division in a TDMA system, the comparator compares the outputs of the first and second detection circuits with each other, turns on one of the first and second switches and turns off the other of the first and second switches.

15. The system according to claim 14, wherein
the comparator turns on the second switch and turns off the first switch when the output of the first detection circuit is higher than the output of the second detection circuit,
the comparator turns on the first switch and turns off the second switch when the output of the first detection circuit is lower than the output of the second detection circuit, and
the comparator does not change over on/off states of the first and second switches when the output of the first detection circuit is equal to the output of the second detection circuit.

* * * * *